United States Patent
Seki et al.

(10) Patent No.: US 8,227,901 B2
(45) Date of Patent: Jul. 24, 2012

(54) MESA TYPE SEMICONDUCTOR DEVICE AND MANUFACTURING METHOD THEREOF

(75) Inventors: Katsuyuki Seki, Ojiya (JP); Akira Suzuki, Ota (JP); Keita Odajima, Fukaya (JP); Kikuo Okada, Moriguchi (JP); Koujiro Kameyama, Ota (JP)

(73) Assignees: SANYO Semiconductor Co., Ltd., Gunma (JP); SANYO Semiconductor Manufacturing Co., Ltd., Ojiya-shi (JP); Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 12/482,674

(22) Filed: Jun. 11, 2009

(65) Prior Publication Data

US 2009/0309194 A1  Dec. 17, 2009

(30) Foreign Application Priority Data

Jun. 12, 2008  (JP) .................................. 2008-153851

(51) Int. Cl.
*H01L 29/06* (2006.01)

(52) U.S. Cl. ........ 257/623; 257/751; 257/637; 257/622; 438/639; 438/435; 438/700; 438/702

(58) Field of Classification Search ................. 257/623, 257/E29.005, E21.09, E21.577, E21.585, 257/774, 622, 624, 625, 626, 750, 751, 773, 257/776, 701, 700, 702, 635, 636, 637; 438/637, 438/638, 639, 640, 668, 478, 465, 113, 114, 438/460, 700, 704, 758, 696, 701, 703, 761, 438/778, 576, 435, 424

See application file for complete search history.

(56) References Cited

U.S. PATENT DOCUMENTS 3,973,270 A * 8/1976 Schroder et al. .............. 257/461
(Continued)

FOREIGN PATENT DOCUMENTS

JP  57-196585  12/1982
(Continued)

OTHER PUBLICATIONS

Matsushita JP 2002-261269 machine translation Sep. 13, 2002 (pp. 1-11).*

(Continued)

*Primary Examiner* — Ha Tran T Nguyen
*Assistant Examiner* — Thanh Y. Tran
(74) *Attorney, Agent, or Firm* — Morrison & Foerster LLP (57) ABSTRACT

This invention is directed to solving problems with a mesa type semiconductor device, which are deterioration in a withstand voltage and occurrence of a leakage current caused by reduced thickness of a second insulation film on an inner wall of a mesa groove corresponding to a PN junction, and offers a mesa type semiconductor device of high withstand voltage and high reliability and its manufacturing method. After the mesa groove is formed by dry-etching, wet-etching with an etching solution including hydrofluoric acid and nitric acid is further applied to a sidewall of the mesa groove to form an overhang made of the first insulation film above an upper portion of the mesa groove. The overhang serves as a barrier to prevent the second insulation film formed in the mesa groove and on the first insulation film around the mesa groove beyond an area of the overhang from flowing toward a bottom of the mesa groove due to an increased fluidity resulting from a subsequent thermal treatment. As a result, the inner wall of the mesa groove corresponding to the PN junction is covered with the second insulation film thick enough to secure a desired withstand voltage and to reduce a leakage current.

11 Claims, 8 Drawing Sheets

U.S. PATENT DOCUMENTS

| | | | |
|---|---|---|---|
| 4,007,104 | A | 2/1977 | Summers et al. |
| 4,051,506 | A | 9/1977 | Horie |
| 4,179,794 | A * | 12/1979 | Kosugi et al. ............... 438/465 |
| 4,389,281 | A | 6/1983 | Anantha et al. |
| 4,663,832 | A * | 5/1987 | Jambotkar ................. 438/437 |
| 4,725,562 | A | 2/1988 | El-Kareh et al. |
| 4,738,936 | A * | 4/1988 | Rice ............................ 438/286 |
| 4,746,963 | A | 5/1988 | Uchida et al. |
| 4,775,643 | A | 10/1988 | Wetteroth |
| 5,661,091 | A * | 8/1997 | Duinkerken et al. ...... 438/424 |
| 6,383,933 | B1 | 5/2002 | Shu et al. |
| 7,192,848 | B2 * | 3/2007 | Neki ........................... 438/465 |
| 2001/0026994 | A1 | 10/2001 | Watanabe |
| 2008/0073752 | A1 * | 3/2008 | Asai et al. .................. 257/615 |
| 2009/0309193 | A1 | 12/2009 | Seki et al. |

FOREIGN PATENT DOCUMENTS

| | | |
|---|---|---|
| JP | 2002-261269 | 9/2002 |
| JP | 2003-347306 | 12/2003 |
| JP | 2005-51111 | 2/2005 |
| JP | 2007-311655 | 11/2007 |
| KR | 10-2007-0111950 | 11/2007 |

OTHER PUBLICATIONS

Seki, et al., U.S. Office Action mailed Feb. 18, 2011, directed to U.S. Appl. No. 12/481,292; 8 pages.

Seki et al., U.S. Office Action mailed Aug. 1, 2011, directed to related U.S. Appl. No. 12/481,292; 12 pages.

Seki et al., U.S. Office Action mailed Feb. 6, 2012, directed to U.S. Appl. No. 12/481,292; 10 pages.

\* cited by examiner

MESA TYPE SEMICONDUCTOR DEVICE AND MANUFACTURING METHOD THEREOF

CROSS-REFERENCE OF THE INVENTION

This application claims priority from Japanese Patent Application No. 2008-153851, the content of which is incorporated herein by reference in its entirety.

BACKGROUND OF THE INVENTION

1. Field of the Invention

This invention relates to a semiconductor device having a mesa groove and its manufacturing method. In this application, the semiconductor device having the mesa groove is denoted as a mesa type semiconductor device.

2. Description of the Related Art

Figure 12:
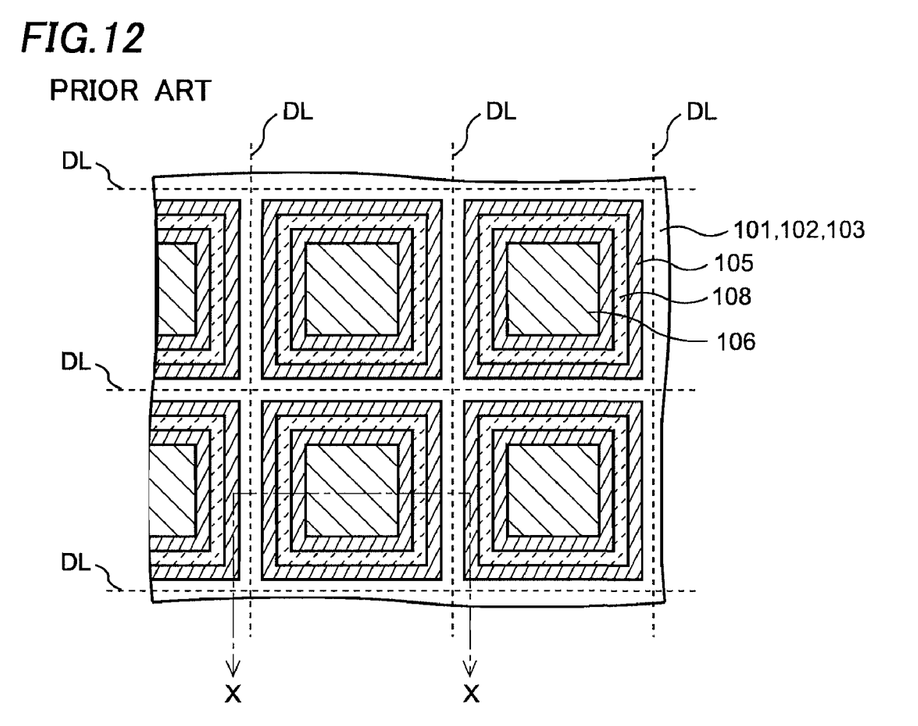
FIG. 12 is a plan view showing a mesa type diode and its manufacturing method according to a prior art.
Figure 13:
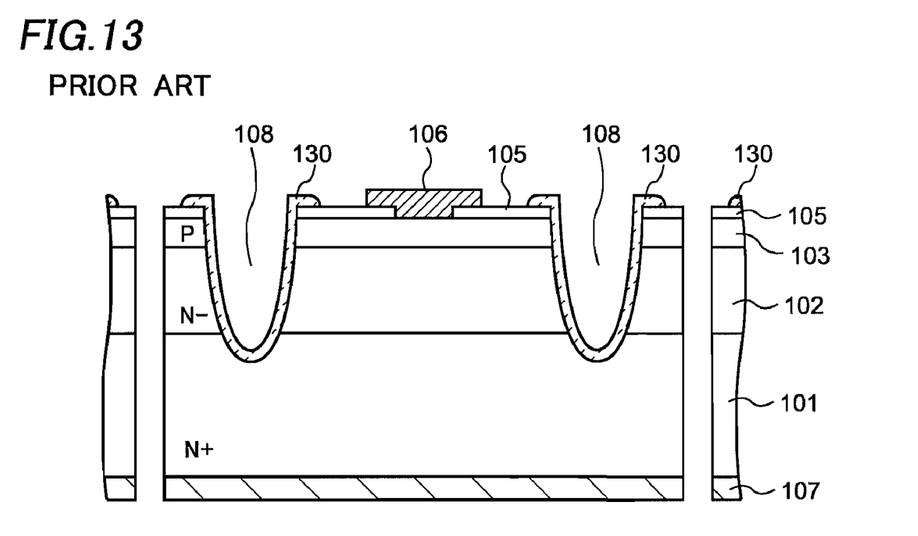
FIG. 13 is a cross-sectional view showing the mesa type diode according to the prior art.

A mesa type power diode has been known as one of the mesa type semiconductor devices. A mesa type diode according to a prior art is described referring to FIGS. 12 and 13. FIG. 12 is an outline plan view showing a semiconductor wafer in which a plurality of the mesa type diodes according to the prior art is arrayed in a matrix form. FIG. 13 is a cross-sectional view of a section X-X in FIG. 12, showing the wafer after being diced along scribe lines DL.

An N⁻ type semiconductor layer 102 is formed on a surface of an N⁺ type semiconductor substrate 101. A first insulation film 105 is formed on a P type semiconductor layer 103 that is formed in a surface of the N⁻ type semiconductor layer 102. There is formed an anode electrode 106 that is electrically connected with the P type semiconductor layer 103.

Also, there is formed a mesa groove 108 that extends from a surface of the P type semiconductor layer 103 to the N⁺ type semiconductor substrate 101. The mesa groove 108 penetrates through the N⁻ type semiconductor layer 102, and its bottom is located inside the N⁺ type semiconductor substrate 101. Sidewalls of the mesa groove 108 are tapered down from the surface of the P type semiconductor layer 103 to the bottom of the mesa groove 108 to have a normal tapered shape. The mesa type diode is surrounded by the mesa groove 108 to have a mesa type structure.

A second insulation film 130 made of a polyimide film is formed to cover the sidewalls of the mesa groove 108. A cathode electrode 107 is formed on a back surface of the N⁺ type semiconductor substrate 101.

The mesa type semiconductor device is described in Japanese Patent Application Publication No. 2003-347306, for example.

Figure 14:
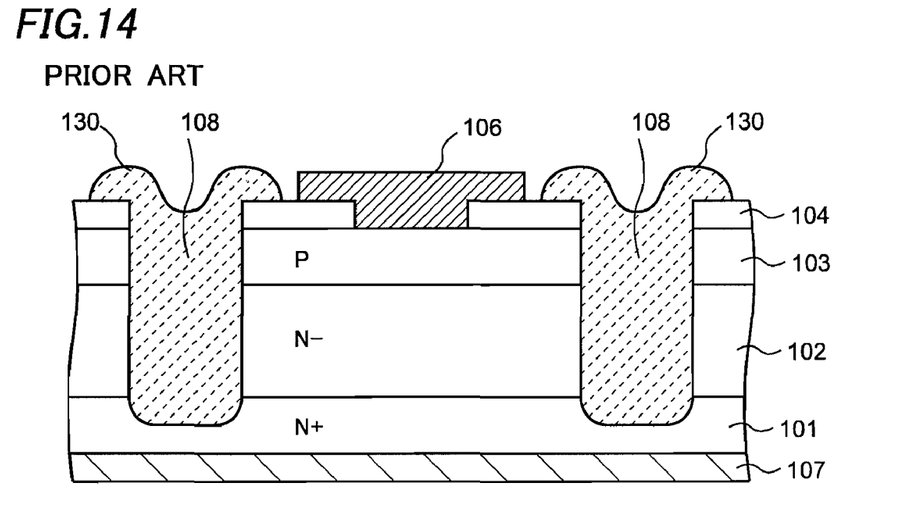
FIG. 14 is a cross-sectional view showing the mesa type diode and its manufacturing method according to the prior art.
Figure 15:
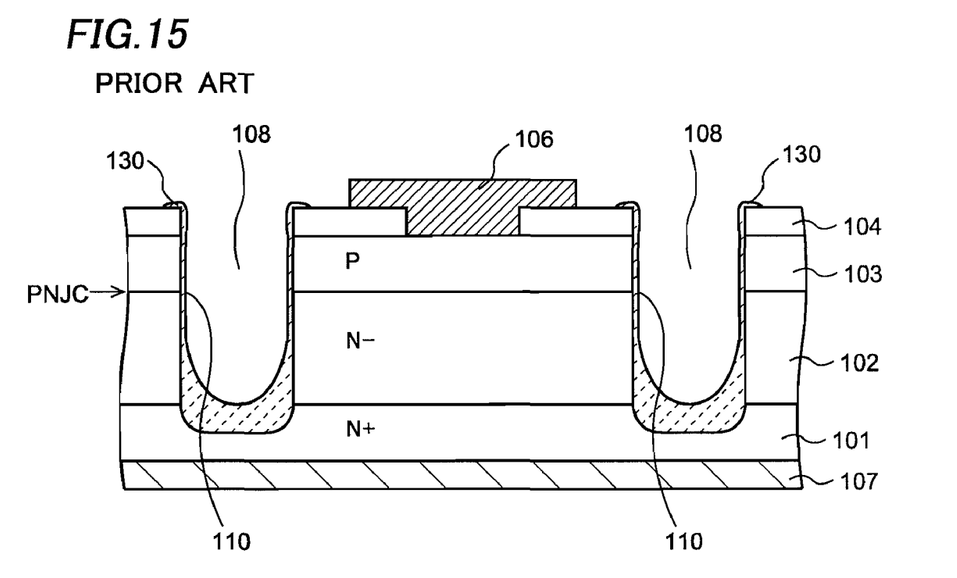
FIG. 15 is a cross-sectional view showing the mesa type diode and its manufacturing method according to the prior art.

The second insulation film 130 in the conventional mesa type diode is shown in FIG. 13 to cover inner walls of the mesa groove 108 with a uniform thickness. In reality, however, the second insulation film 130 is thinner at upper portions of the inner walls of the mesa groove 108 and accumulates thicker at the bottom of the mesa groove 108, as shown in FIG. 15. The shape as described above is formed in the following process. When the second insulation film 130 is provided into the mesa groove 108 by dispensing or the like, the mesa groove 108 is filled with the second insulation film 130, as shown in FIG. 14. Imidization reaction takes place during subsequent thermal treatment, and because of increased fluidity of the second insulation film 130, the second insulation film 130 flows as a whole toward the bottom of the mesa groove 108 to reduce the thickness of the second insulation film 130 at the upper portions of the inner walls of the mesa groove 108, as shown in FIG. 15.

As a result, the thickness of the second insulation film 130 is reduced at a sidewall 110 of the mesa groove 108 corresponding to a PN junction PNJC where an electric field is most intense, causing serious problems to be solved such as deterioration in a withstand voltage of the PN junction and increase in a leakage current, which reduce yield and reliability. As a method to solve the problems, it is conceivable that the forming of the second insulation film 130 is repeated several times. However, this method increases a cost of the semiconductor device because a material of the second insulation film 130 is expensive.

SUMMARY OF THE INVENTION

The invention provides a method of manufacturing a mesa type semiconductor device. The method includes providing a semiconductor substrate of a first general conductivity type and forming a first semiconductor layer of the first general conductivity type on the semiconductor substrate. The impurity concentration of the first semiconductor layer is lower than the impurity concentration of the semiconductor substrate. The method also includes forming a second semiconductor layer of a second general conductivity type on the first semiconductor layer, forming a first insulation film patterned to cover a portion of the second semiconductor layer, etching the second semiconductor layer, the first semiconductor layer and the semiconductor substrate using the patterned first insulation film as a mask so as to form a groove so that the semiconductor substrate is exposed at the bottom of the groove, removing an upper portion of the sidewall of the groove by etching so as to widen the groove at a top portion thereof so that an edge portion of the first insulation film is left overhanging a portion of the groove widened by the removal of the upper portion, and forming a second insulation film that covers the sidewall of the groove and extends outside the groove so as to reach a top surface of the overhanging first insulation film.

The invention also provides a mesa type semiconductor device that includes a semiconductor substrate of a first general conductivity type and a first semiconductor layer of the first general conductivity type disposed on the semiconductor substrate. The impurity concentration of the first semiconductor layer is lower than the impurity concentration of the semiconductor substrate. The device also includes a second semiconductor layer of a second general conductivity type disposed on the first semiconductor layer so as to form a PN junction between the first and second semiconductor layers, a mesa groove penetrating into the semiconductor substrate through the first and second semiconductor layers, a first insulation film disposed on the second semiconductor layer so that an edge portion of the first insulation film overhangs the mesa groove, and a second insulation film disposed on a sidewall of the mesa groove and hanging from the overhanging first insulation film.

DETAILED DESCRIPTION OF THE INVENTION

A mesa type semiconductor device and its manufacturing method according to a first embodiment of this invention are described taking an example where the mesa type semiconductor device is a mesa type diode. FIGS. 1 through 7 are cross-sectional views showing the mesa type diode and its manufacturing method according to the first embodiment. It is noted that drawings used in the following explanation on the manufacturing method of the mesa type diode show only one mesa type diode out of a plurality of mesa type diodes for the sake of simplicity, although the manufacturing method is applied to a semiconductor substrate in a wafer form in which the plurality of mesa type diodes is arrayed in a matrix form.

Figure 1:
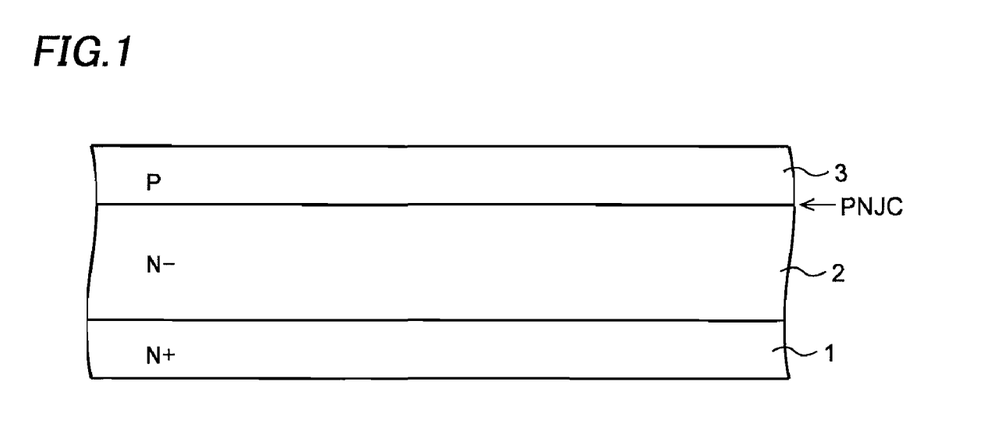
FIG. 1 is a cross-sectional view showing a mesa type diode and its manufacturing method according to a first embodiment of this invention.

There is provided an $N^+$ type semiconductor substrate 1 (a single crystalline silicon substrate, for example) that is doped with high concentration N type impurities such as phosphorus, as shown in FIG. 1. An $N^-$ type semiconductor layer 2, that is an N type semiconductor layer with a low impurity concentration, is formed on a surface of the semiconductor substrate 1 by epitaxial growth. A double layer structure made of the $N^+$ type semiconductor substrate 1 and the $N^-$ type semiconductor layer 2 may be formed by thermally diffusing impurities such as phosphorus to form $N^+$ type semiconductor layers in surfaces on both sides of an $N^-$ type semiconductor substrate and by subsequent chemical etching or mechanical polishing to remove one of the $N^+$ type semiconductor layers. Especially in manufacturing an ultra high withstand voltage product which requires the $N^-$ type semiconductor layer 2 being thick, there are cases where the diffusion method is preferable to the epitaxial method. It is noted that conductivity types such as $N^+$, N and $N^-$ belong in one general conductivity type, and conductivity types such as $P^+$, P and $P^-$ belong in another general conductivity type.

After that, a P type semiconductor layer 3 is formed by diffusing P type impurities such as boron into a surface of the $N^-$ type semiconductor layer 2. As a result, a PN junction PNJC is formed at an interface between the $N^-$ type semiconductor layer 2 and the P type semiconductor layer 3. In the structure described above, a thickness of stacked layers of the $N^+$ type semiconductor substrate 1, the $N^-$ type semiconductor layer 2 and the P type semiconductor layer 3 is approximately 200 μm, for example.

Figure 2:
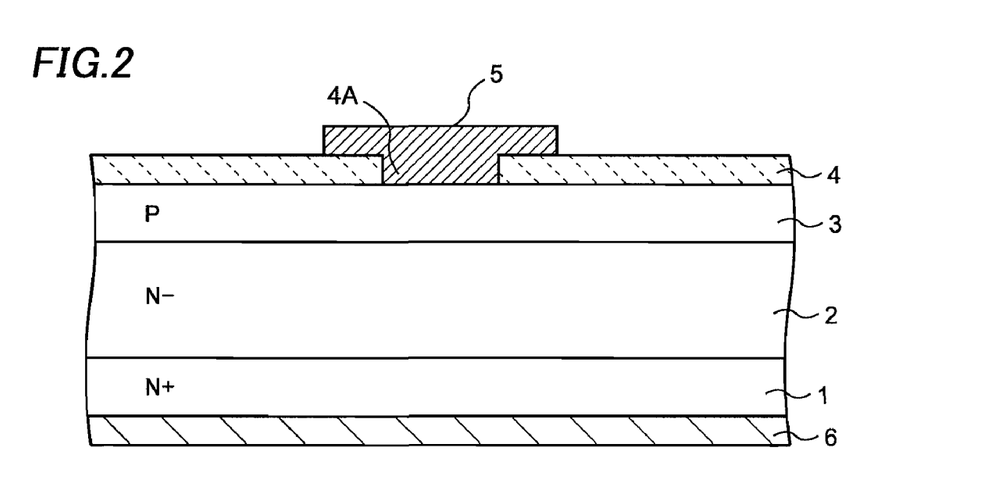
FIG. 2 is a cross-sectional view showing the mesa type diode and its manufacturing method according to the first embodiment of this invention.

Next, a first insulation film 4 such as a silicon oxide film is formed on a surface of the P type semiconductor layer 3 by a thermal oxidation method or a CVD (Chemical Vapor Deposition) method, as shown in FIG. 2. A silicon nitride film may be used as the first insulation film 4. After that, a portion of the first insulation film 4 is removed by etching to provide the first insulation film 4 with an opening 4A that exposes a portion of the P-type semiconductor layer 3. Next, there is formed an anode electrode 5 that is connected to the P type semiconductor layer 3 through the opening 4A in the first insulation film 4. The anode electrode 5 is made of a conductive material such as aluminum, and is formed by sputtering, a vapor deposition or the like, and by subsequent patterning into a predetermined shape. On the other hand, a cathode electrode 6 is formed on a back surface of the $N^+$ type semiconductor substrate 1 by sputtering a conductive material such as aluminum, for example, in a way similar to forming the anode electrode 5.

Figure 3:
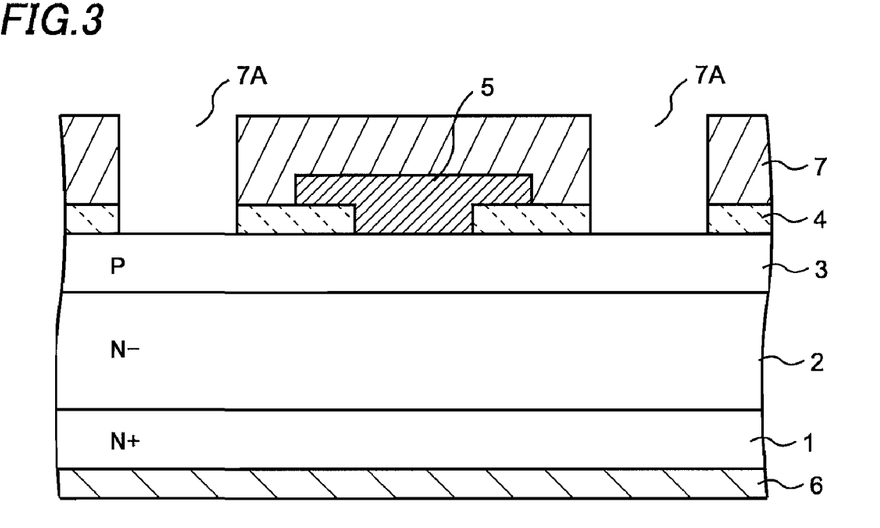
FIG. 3 is a cross-sectional view showing the mesa type diode and its manufacturing method according to the first embodiment of this invention.

Next, a photoresist layer 7 having an opening 7A in a region where a mesa groove 8 is to be formed is formed on the first insulation film 4, as shown in FIG. 3. Then, the first insulation film 4 exposed in the opening 7A is removed by etching using the photoresist layer 7 as a mask. Although a wet-etching method is used in the embodiment, a dry-etching method may be used instead. After the etching, the photoresist layer 7 used as the mask is removed by an ashing method or with a resist removing solution.

Figure 4:
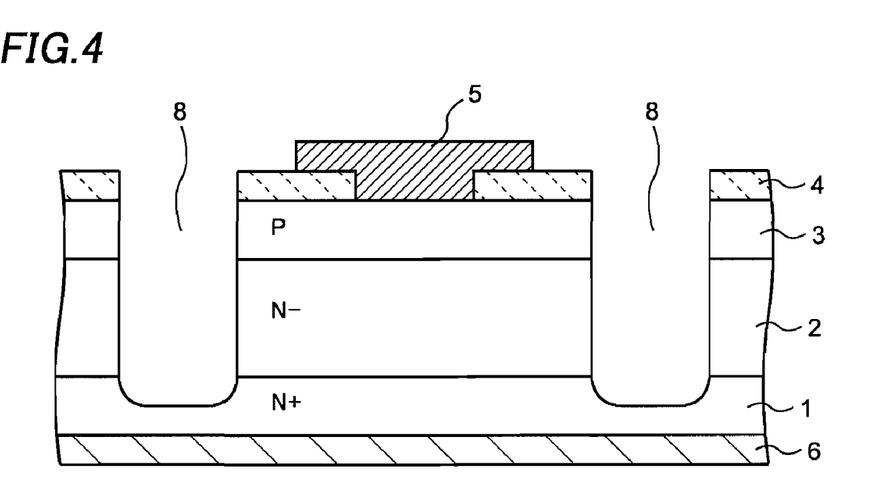
FIG. 4 is a cross-sectional view showing the mesa type diode and its manufacturing method according to the first embodiment of this invention.
Figure 5:
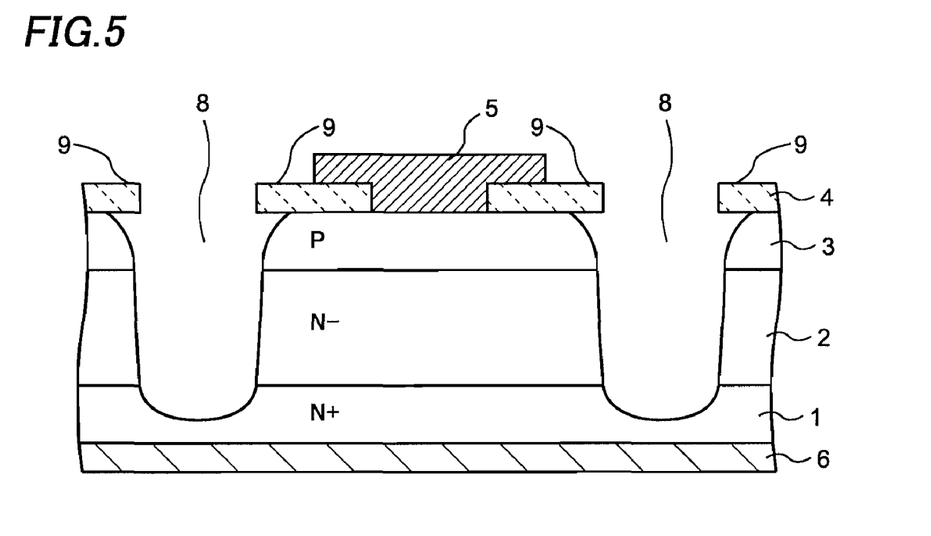
FIG. 5 is a cross-sectional view showing the mesa type diode and its manufacturing method according to the first embodiment of this invention.

Next, as shown in FIG. 4, the mesa groove 8 is formed by dry-etching all the way through the P type semiconductor layer 3 and the $N^-$ type semiconductor layer 2 and partway through a thickness of the $N^+$ type semiconductor substrate 1 using the first insulation film 4 or the like as a mask. After that, while a damage layer caused in the sidewall of the mesa groove 8 by the dry-etching is removed using an etching solution including hydrofluoric acid and nitric acid, etching of the mesa groove 8 is further advanced to form an overhang 9 made of the first insulation film 4 protruding over an upper portion of the mesa groove 8, as shown in FIG. 5. A length of the overhang 9 in this embodiment is approximately 2-3 μm when a width of the opening 7A in the first insulation film 4 is 50 μm and a thickness of the first insulation film 4 is 800 nm. It is possible to form the most suitable length of the overhang 9 depending on the material, the thickness and the like of the first insulation film 4 in the process step described above, which is important in this embodiment.

Figure 6:
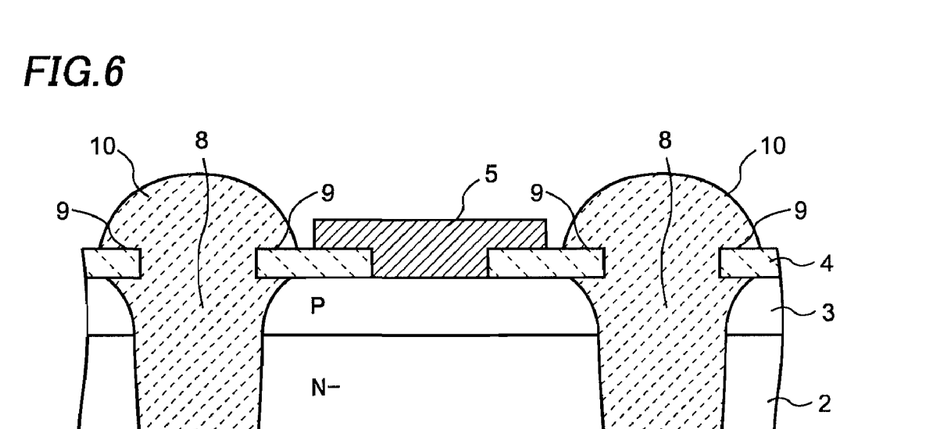
FIG. 6 is a cross-sectional view showing the mesa type diode and its manufacturing method according to the first embodiment of this invention.
Figure 7:
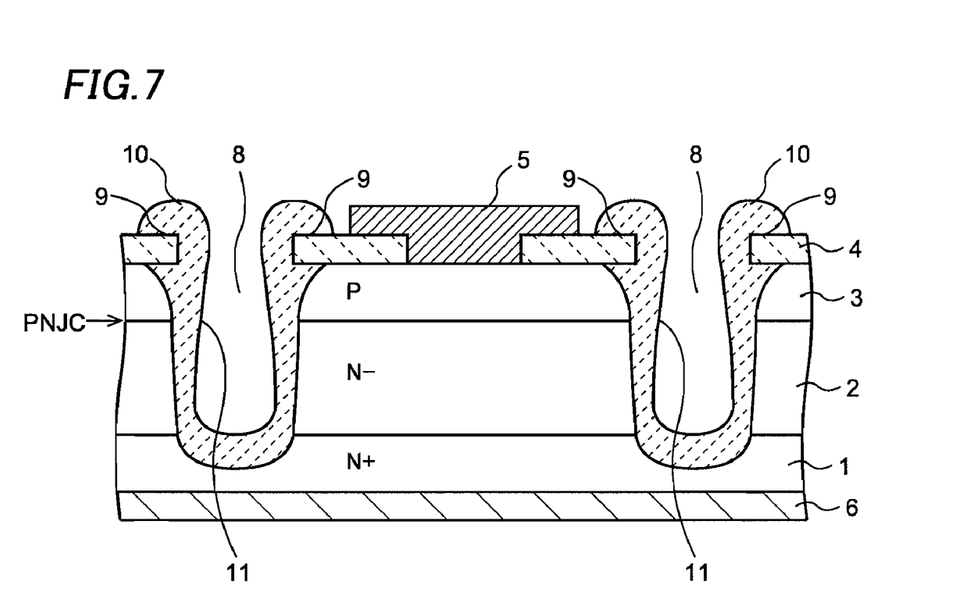
FIG. 7 is a cross-sectional view showing the mesa type diode and its manufacturing method according to the first embodiment of this invention.

Next, a second insulation film 10 is formed by a dispensing method or a screen printing method in and over the mesa groove 8 and over the first insulation film 4 around the mesa groove 8 and beyond a region of the overhang 9, as shown in FIG. 6. Forming the second insulation film 10 in the mesa groove 8 is made easier if the second insulation film 10 is dispensed under a reduced pressure. In a subsequent thermal treatment, the overhang 9 serves as a barrier to prevent the second insulation film 10 with increased fluidity due to the thermal treatment from flowing down toward the bottom of the mesa groove 8 as shown in FIG. 7, so that the second insulation film 10 formed on the sidewall 11 of the mesa groove 5 corresponding to the PN junction PNJC is made thick enough to secure the predetermined withstand voltage. In this embodiment, the second insulation film 10 is made of polyimide and the thermal treatment is performed at 400° C., which is a little higher temperature than an imidization temperature, for 2 hours. An epoxy resin may be also used as the second insulation film 10. As a result, the second insulation film 10 is hanging from the overhang 9 to cover the sidewall of the mesa groove 8.

The embodiment gives a remarkable improvement over the prior art in which the sidewall 110 of the mesa groove 108 corresponding to the PN junction PNJC at the upper portion of the mesa groove 108 is covered only with the thin second insulation film 130, as shown in FIG. 15. With the mesa type semiconductor device according to the first embodiment, the withstand voltage of approximately 1100 V was obtained for the N⁻ type semiconductor layer 2 having a thickness of 75 μm and a resistivity of 50 Ωcm. In this case, the thickness of the second insulation film 10 at the sidewall 11 of the mesa groove 8 corresponding to the PN junction PNJC needs to be around 5 μm at the least.

Figure 8:
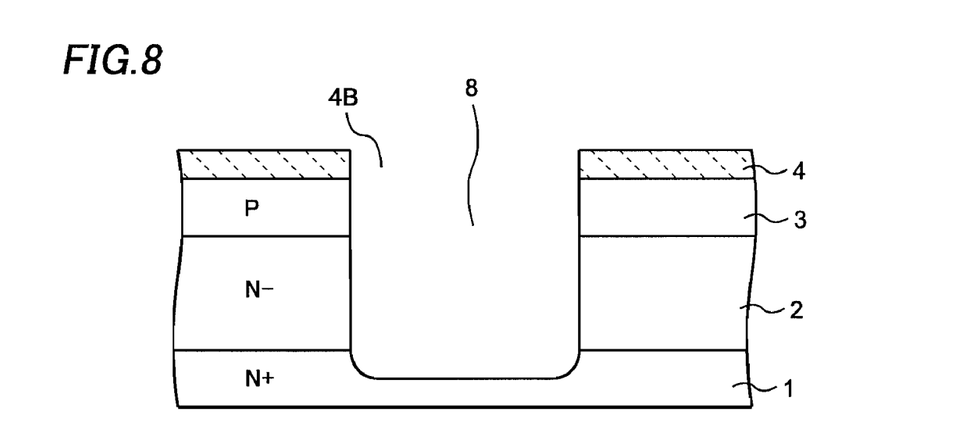
FIG. 8 is a cross-sectional view showing a mesa groove in a mesa type diode and its manufacturing method according to a second embodiment of this invention.

A semiconductor device according to a second embodiment of this invention will be described referring to FIGS. 8-10. The same symbols are used for the common components as in the first embodiment and explanations on them are omitted. Because the semiconductor device according to the second embodiment differs from the semiconductor device according to the first embodiment only in the process to form the overhang 9, explanations are given mainly on the mesa groove 8 and the overhang 9.

First, a substrate made of the N⁺ type semiconductor substrate 1, the N⁻ type semiconductor layer 2 and the P type semiconductor layer 3 is formed in the same way as described in the first embodiment. The first insulation film 4 is formed on the substrate by CVD or the like. The first insulation film 4 is etched using a photoresist layer as a mask to form an opening 4B at a location where the mesa groove 8 is to be formed, as shown in FIG. 8. Next, the mesa groove 8 is formed by dry-etching all the way through the P type semiconductor layer 3 and the N⁻ type semiconductor layer 2 and partway through the N⁺ type semiconductor substrate 1 using the first insulation film 4 as a mask. The mesa groove 8 may be formed by the dry-etching using a photoresist layer as the mask instead of the first insulation film 4.

Figure 9:
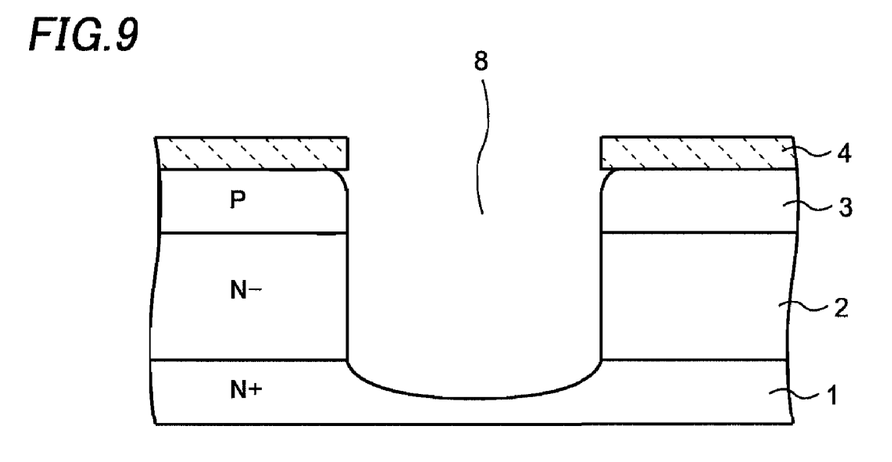
FIG. 9 is a cross-sectional view showing the mesa groove in the mesa type diode and its manufacturing method according to the second embodiment of this invention.
Figure 10:
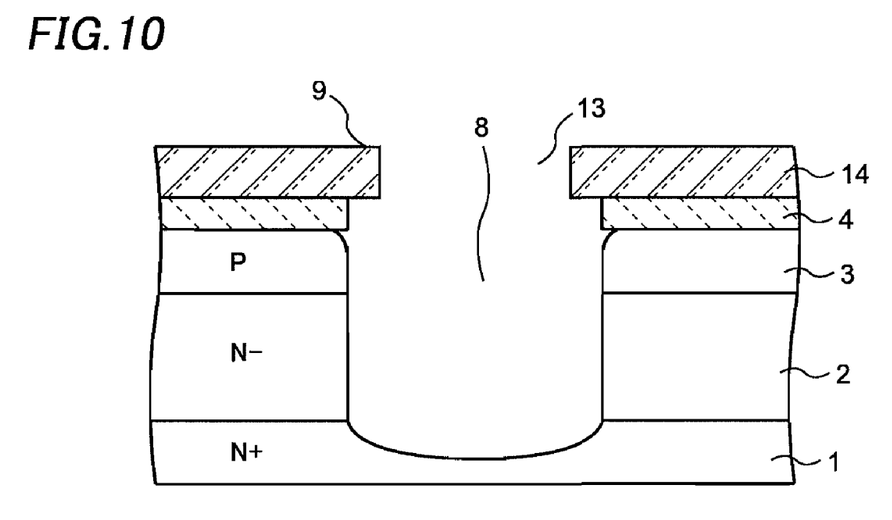
FIG. 10 is a cross-sectional view showing the mesa groove in the mesa type diode and its manufacturing method according to the second embodiment of this invention.

Next, as shown in FIG. 9, the inner wall of the mesa groove 8 is lightly etched with an etching solution including hydrofluoric acid and nitric acid using the first insulation film 4 as a mask so as to remove the damage layer caused by the dry-etching. Finally, a third insulation film 14 having an opening 13 smaller in width than the mesa groove 8 and located to overlap the mesa groove 8 is formed on the first insulation film 4, as shown in FIG. 10. A so-called permanent resist such as an organic resist film, an epoxy resin film or the like may be used as the third insulation film 14. Through the process steps as described above, there is formed the overhang 9 hanging over the mesa groove 8. A shape of the overhang 9 shown in FIG. 10 is similar to that of the overhang 9 shown in FIG. 5. A mesa type semiconductor device similar to the semiconductor device according to the first embodiment can be completed through the process steps shown in FIGS. 6 and 7.

To describe the method to form the third insulation film 14 more in detail, a photosensitive organic film made of an organic resist film or epoxy resin, for example, is formed over the semiconductor substrate 1, and the opening 13 having a desired aperture is formed in the photosensitive organic film by subsequent exposure and development process. When the photosensitive organic film is of a negative type, for example, the photosensitive organic film formed on the first insulation film 4 is exposed to the light while the photosensitive organic film formed in a region where the opening 13 is to be formed is not exposed to the light, so that the photosensitive organic film formed in the region where the opening 13 is to be formed is removed by the subsequent development process. Although the photosensitive organic film is formed so as not to fill the mesa groove 8 in the method described above, the opening 13 having the desired aperture can be formed by not exposing the photosensitive organic film in the region where the opening 13 is to be formed, even when the photosensitive organic film is formed over the semiconductor substrate 1 including the inside of the mesa groove 8.

Figure 11:
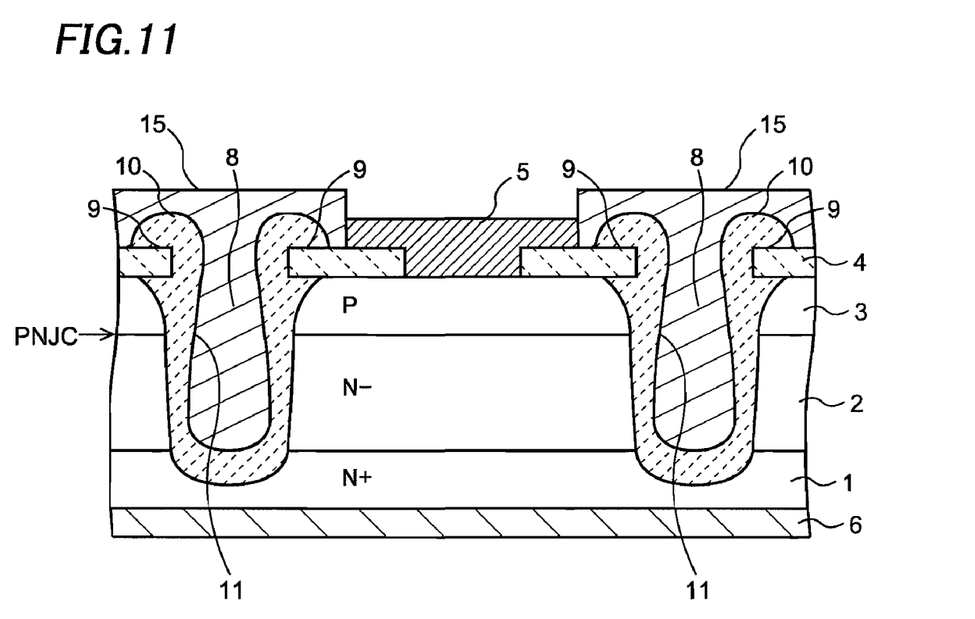
FIG. 11 is a cross-sectional view showing a mesa groove in a mesa type diode and its manufacturing method according to a third embodiment of this invention.

Next, a semiconductor device according to a third embodiment of this invention will be explained referring to FIG. 11. The same symbols are used for the common components as in the first and second embodiments and explanations on them are omitted.

The semiconductor device according to the third embodiment is directed to enhancing the reliability of the semiconductor device by improving a structure of a protection film, regardless whether there is the overhang 9 or not.

When a polyimide film is used as the second insulation film 10, there is a problem that the polyimide film is highly hygroscopic although it is a highly insulative material. Thus, a moisture-resistant insulation film 15 is formed to cover the polyimide film as shown in FIG. 11 in order to complement the polyimide film. The insulation film 15 is preferably made of a so-called permanent resist such as an organic resist film, an epoxy resin film, a silicon nitride film or the like. The moisture resistance of the semiconductor device can be improved by forming a stack of the polyimide film and the insulation film 15 as described above and using it as the second insulation film 10.

This invention may be applied not only to the mesa type diode described above, but also to other mesa type semiconductor devices such as a mesa type transistor. With the mesa type semiconductor device and its manufacturing method according to the embodiments of this invention, the withstand voltage of the PN junction can be enhanced while the leakage current is reduced.

What is claimed is:
1. A mesa type semiconductor device comprising:
    a semiconductor substrate of a first general conductivity type;
    a first semiconductor layer of the first general conductivity type disposed on the semiconductor substrate, an impurity concentration of the first semiconductor layer being lower than an impurity concentration of the semiconductor substrate;
    a second semiconductor layer of a second general conductivity type disposed on the first semiconductor layer so as to form a PN junction between the first and second semiconductor layers;
    a mesa groove penetrating into the semiconductor substrate through the first and second semiconductor layers;
    a first insulation film disposed on the second semiconductor layer so that an edge portion of the first insulation film overhangs the mesa groove, the first insulation film not extending into the mesa groove so far as to reach the first semiconductor layer; and
    a second insulation film disposed on a sidewall of the mesa groove and hanging from the overhanging first insulation film,
    wherein the overhanging edge portion of the first insulation film has a bottom surface facing the second semiconductor layer and a top surface opposite from the bottom surface, and the second insulation film is in contact with both the top surface and the bottom surface of the first insulation film.

2. The mesa type semiconductor device of claim 1, wherein the second insulation film over the PN junction is thick enough to secure a predetermined withstand voltage.

3. The mesa type semiconductor device of claim 2, wherein the first insulation film comprises a silicon oxide film or a silicon nitride film.

4. The mesa type semiconductor device of claim 2, wherein the second insulation film comprises a stack of a polyimide film and a silicon nitride film.

5. The mesa type semiconductor device of claim 2, wherein the second insulation film comprises a polyimide, an epoxy resin, a combination of a polyimide and an epoxy resin or a combination of a polyimide and an organic resist.

6. The mesa type semiconductor device of claim 1, wherein the first insulation film comprises a silicon oxide film or a silicon nitride film.

7. The mesa type, semiconductor device of claim 1, wherein the second insulation film comprises a stack of a polyimide film and a silicon nitride film.

8. The mesa type semiconductor device of claim 1, wherein the second insulation film comprises a polyimide, an epoxy resin, a combination of a polyimide and an epoxy resin or a combination of a polyimide and an organic resist.

9. The mesa type semiconductor device of claim 1, wherein a lateral length of the mesa groove at the second semiconductor layer is larger than a lateral length of the mesa groove at the first semiconductor layer.

10. The mesa type semiconductor device of claim 9, wherein the lateral length of the mesa groove at the second semiconductor layer is larger than the lateral length of the mesa groove at the first semiconductor layer by 4 µm or more.

11. The mesa type semiconductor device of claim 1, wherein the second insulation film is thicker at the PN junction than at a portion of the mesa groove lower than the PN junction.

* * * * *